US011569112B2

(12) United States Patent
Endo et al.

(10) Patent No.: US 11,569,112 B2
(45) Date of Patent: Jan. 31, 2023

(54) SUBSTRATE PROCESSING APPARATUS AND METHOD OF OPENING/CLOSING LID OF SUBSTRATE ACCOMMODATING VESSEL

(71) Applicant: Tokyo Electron Limited, Tokyo (JP)

(72) Inventors: Eiki Endo, Nirasaki (JP); Hiroyuki Takatsuka, Nirasaki (JP); Tatsuya Mukoyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 93 days.

(21) Appl. No.: 17/290,833

(22) PCT Filed: Oct. 23, 2019

(86) PCT No.: PCT/JP2019/041455
§ 371 (c)(1),
(2) Date: May 3, 2021

(87) PCT Pub. No.: WO2020/095675
PCT Pub. Date: May 14, 2020

(65) Prior Publication Data
US 2021/0375655 A1  Dec. 2, 2021

(30) Foreign Application Priority Data

Nov. 5, 2018  (JP) .............................. JP2018-208257

(51) Int. Cl.
*H01L 21/677* (2006.01)
*H01L 21/67* (2006.01)
*H01L 21/673* (2006.01)

(52) U.S. Cl.
CPC .. *H01L 21/67772* (2013.01); *H01L 21/67288* (2013.01); *H01L 21/67353* (2013.01); *H01L 21/67778* (2013.01)

(58) Field of Classification Search
CPC ......... H01L 21/67772; H01L 21/67288; H01L 21/67353; H01L 21/67778;
(Continued)

(56) References Cited

U.S. PATENT DOCUMENTS

| 2002/0073576 A1* | 6/2002 | Kamikawa ........ H01L 21/67051 34/448 |
| 2008/0236755 A1* | 10/2008 | Kondoh ............ H01L 21/67775 118/500 |

FOREIGN PATENT DOCUMENTS

JP  2013-179287 A  9/2013

* cited by examiner

*Primary Examiner* — Glenn F Myers
(74) *Attorney, Agent, or Firm* — Armstrong Teasdale LLP

(57) ABSTRACT

A substrate processing apparatus includes: a substrate processing part including a load port configured to place thereon a substrate accommodating vessel in which at least one substrate is accommodated, and configured to take out the at least one substrate from the substrate accommodating vessel and to perform a series of processes on the at least one substrate; and a controller configured to control an opening and closing of a lid of the substrate accommodating vessel, wherein the controller performs control to open the lid after the substrate accommodating vessel is placed on the load port, and the controller performs control to close the lid when an abnormality occurs in the substrate processing part and when none of the at least one substrate removed from the substrate accommodating vessel can be recovered to the substrate accommodating vessel after a predetermined period of time from the occurrence of the abnormality.

11 Claims, 8 Drawing Sheets

(58) Field of Classification Search
CPC ........ H01L 21/67253; H01L 21/67265; G05B 19/418; G05B 19/41805; G05B 2219/32181; F27B 17/0025; G03F 7/70733; G03F 7/70741; G03F 7/7075; G06Q 10/0832
USPC .......................... 700/95, 108, 121, 213, 218
See application file for complete search history.

FIG. 5

| (A)-(I) | LMArm40 | | | VTMArm70 | | | LMArm40 |
|---|---|---|---|---|---|---|---|
| | FOUP100 | ORT33 | LLM20a | COR61 | PHT62 | LLM20b | CST32 |
| t1 | W1 W2 W3 W4 | | | | | | |
| t2 | W2 W3 W4 | W1 | | | | | |
| t3 | W3 W4 | W2 | W1 | | | | |
| t4 | W4 | W3 | W2 | W1 | ✗ | | |
| t5 | W4 | W3 | | W2 | W1 ✗ | | |

FIG. 6

| (A)-(II) | LMArm40 | | | VTMArm70 | | | LMArm40 |
|---|---|---|---|---|---|---|---|
| | FOUP100 | ORT33 | LLM20a | COR61 | PHT62 | LLM20b | CST32 |
| t1 | W1 W2 W3 W4 | | | | | | |
| t2 | W2 W3 W4 | W1 | | | | | |
| t3 | W3 W4 | W2 | W1 | | | | |
| t4 | W4 | W3 | W2 | W1 ✗ | | | |
| t5 | W4 | W3 | | W2 | W1 ✗ | | |

FIG. 7

| (A)—(III) | LMArm40 | | | VTMArm70 | | | LMArm40 |
|---|---|---|---|---|---|---|---|
| | FOUP100 | ORT33 | LLM20a | COR61 | PHT62 | LLM20b | CST32 |
| t1 | W1 W2 W3 W4 | | | | | | |
| t2 | W2 W3 W4 | W1 | | | | | |
| t3 | W3 W4 | W2 | W1 | | | | |
| t4 | W4 | W3 | ✗W2 | W1 | | | |
| t5 | W4 | W3 | ✗W2 | | W1 | | |
| t6 | W4 | W3 | ✗W2 | | | W1 | |
| t7 | W4 | W3 | ✗W2 | | | | W1 |
| t8 | W1 W4 | W3 | ✗W2 | | | | |

FIG. 8

| (B)—(I) | LMArm40 | | | VTMArm70 | | | LMArm40 |
|---|---|---|---|---|---|---|---|
| | FOUP100 | ORT33 | LLM20a | COR61 | PHT62 | LLM20b | CST32 |
| t1 | W1 W2 W3 W4 | | | | | | |
| t2 | W2 W3 W4 | W1 | | | | | |
| t3 | W3 W4 | W2 | W1 | | | | |
| t4 | W4 | W3 | W2✗W1 | ✗ | ✗ | | |
| t5 | W3 W4 | | W2 | ✗W1 | ✗ | ✗ | |
| t6 | W2 W3 W4 | | | ✗W1 | ✗ | ✗ | |

FIG. 9

| (B)—(II) | LMArm40 | | | VTMArm70 | | | LMArm40 | |
|---|---|---|---|---|---|---|---|---|
| | FOUP100 | ORT33 | LLM20a | COR61 | PHT62 | | LLM20b | CST32 |
| t1 | W1 W2 W3 W4 | | | | | | | |
| t2 | W2 W3 W4 | W1 | | | | | | |
| t3 | W3 W4 | W2 | W1 | | | | | |
| t4 | W4 ✗ W3 | ✗ | ✗ | W2 | W1 | | ✗ | ✗ |
| t5 | ▨ W4 ✗ W3 | ✗ | ✗ | W2 | W1 | | ✗ | ✗ |

FIG. 10

| (C) | LMArm40 | | | VTMArm70 | | | LMArm40 | |
|---|---|---|---|---|---|---|---|---|
| | FOUP100 | ORT33 | LLM20a | COR61 | PHT62 | | LLM20b | CST32 |
| t1 | W1 W2 W3 W4 | | | | | | | |
| t2 | W2 W3 W4 | W1 | | | | | | |
| t3 | W3 W4 | W2 | W1 | | | | | |
| t4 | W4 | ✗ | | W2 | W1 | | | |
| t5 | W4 | ✗ | | | W2 | W1 | | |
| t6 | W4 | ✗ | | | | | W2 | W1 |
| t7 | W4 | ✗ | | | | | | W2 W1 |
| t8 | W1 W4 | ✗ | | | | | | W2 |
| t9 | ▨ W1 W2 W4 | ✗ | | | | | | |

FIG. 11

| (A)—(I) | LMArm40 | | | VTMArm70 | | | LMArm40 | |
|---|---|---|---|---|---|---|---|---|
| | FOUP100 | ORT33 | LLM20a | COR61 | PHT62 | | LLM20b | CST32 |
| t1 | W1 W2<br>W3 W4 | | | | | | | |
| t2 | W2<br>W3 W4 | W1 | | | | | | |
| t3 | W3 W4 | W2 | W1 | | | | | |
| t4 | W4 | W3 | W2 | W1 | | | | |
| t5 | | W4 | W3 | W2 | W1 | | ✗ | |
| t6 | ▨ | W4 | W3 | W2 | W1 | | ✗ | |
| t7 | ▨ | | W4 | W3 | W2 | | W1 | |
| t8 | ▨ | | | W4 | W3 | | W2 | W1 |
| t9 | W1 | | | | W4 | | W3 | W2 |

US 11,569,112 B2

SUBSTRATE PROCESSING APPARATUS AND METHOD OF OPENING/CLOSING LID OF SUBSTRATE ACCOMMODATING VESSEL

CROSS-REFERENCE TO RELATED APPLICATIONS

This application is a National Stage Application of International Patent Application No. PCT/JP2019/041455, having an International Filing Date of Oct. 23, 2019, which claims the benefit of priority to Japanese Patent Application No. 2018-208257, filed Nov. 5, 2018, the entire contents of each of which are hereby incorporated by reference herein.

TECHNICAL FIELD

The disclosure relates to a substrate processing apparatus and a method of opening/closing a lid of a substrate accommodating vessel.

BACKGROUND

Patent Document 1 discloses a method of purging a substrate accommodating vessel, in which a lid of the substrate accommodating vessel is opened while a dry gas is continuously supplied into the substrate accommodating vessel, and after processing of the substrate in the substrate accommodating vessel is completed, the lid is closed and the supply of the dry gas is stopped. According to the substrate accommodating vessel purging method disclosed in Patent Document 1, the interior of the substrate accommodating vessel is kept in a low-humidity state to prevent $SiO_2$ and hydrofluoric acid from being generated inside the substrate accommodating vessel. As a result, the substrate inside the substrate accommodating vessel can be held in a good state.

PRIOR ART DOCUMENT

[Patent Document]
Patent Document 1: Japanese Laid-Open Patent Publication No. 2013-179287

SUMMARY

The technology according to the present disclosure suppresses particles from adhering to a substrate which is in a standby state inside a substrate accommodating vessel.

A substrate processing apparatus according to an aspect of the present disclosure includes: a substrate processing part including a load port configured to place thereon a substrate accommodating vessel in which at least one substrate is accommodated, and configured to remove the at least one substrate from the substrate accommodating vessel placed on the load port and to perform a series of processes on the at least one substrate; and a controller configured to control an opening and closing of a lid of the substrate accommodating vessel placed on the load port, wherein the controller performs control to open the lid after the substrate accommodating vessel is placed on the load port, and the controller performs control to close the lid when an abnormality occurs in the substrate processing part and when none of the at least one substrate removed from the substrate accommodating vessel are capable of being recovered to the substrate accommodating vessel after a predetermined period of time from the occurrence of the abnormality.

According to the present disclosure, it is possible to suppress particles from adhering to a substrate which is in a standby state inside a substrate accommodating vessel.

BRIEF DESCRIPTION OF DRAWINGS

FIG. 5 is an explanatory view illustrating a sequential flow of the wafer processing according to a processing recipe.

FIG. 6 is an explanatory view illustrating a sequential flow of the wafer processing according to a processing recipe.

FIG. 7 is an explanatory view illustrating a sequential flow of the wafer processing according to a processing recipe.

FIG. 8 is an explanatory view illustrating a sequential flow of the wafer processing according to a processing recipe.

FIG. 9 is an explanatory view illustrating a sequential flow of the wafer processing according to a processing recipe.

FIG. 10 is an explanatory view illustrating a sequential flow of the wafer processing according to a processing recipe.

FIG. 11 is an explanatory view illustrating a sequential flow of the wafer processing according to a processing recipe.

DETAILED DESCRIPTION

Figure 1:
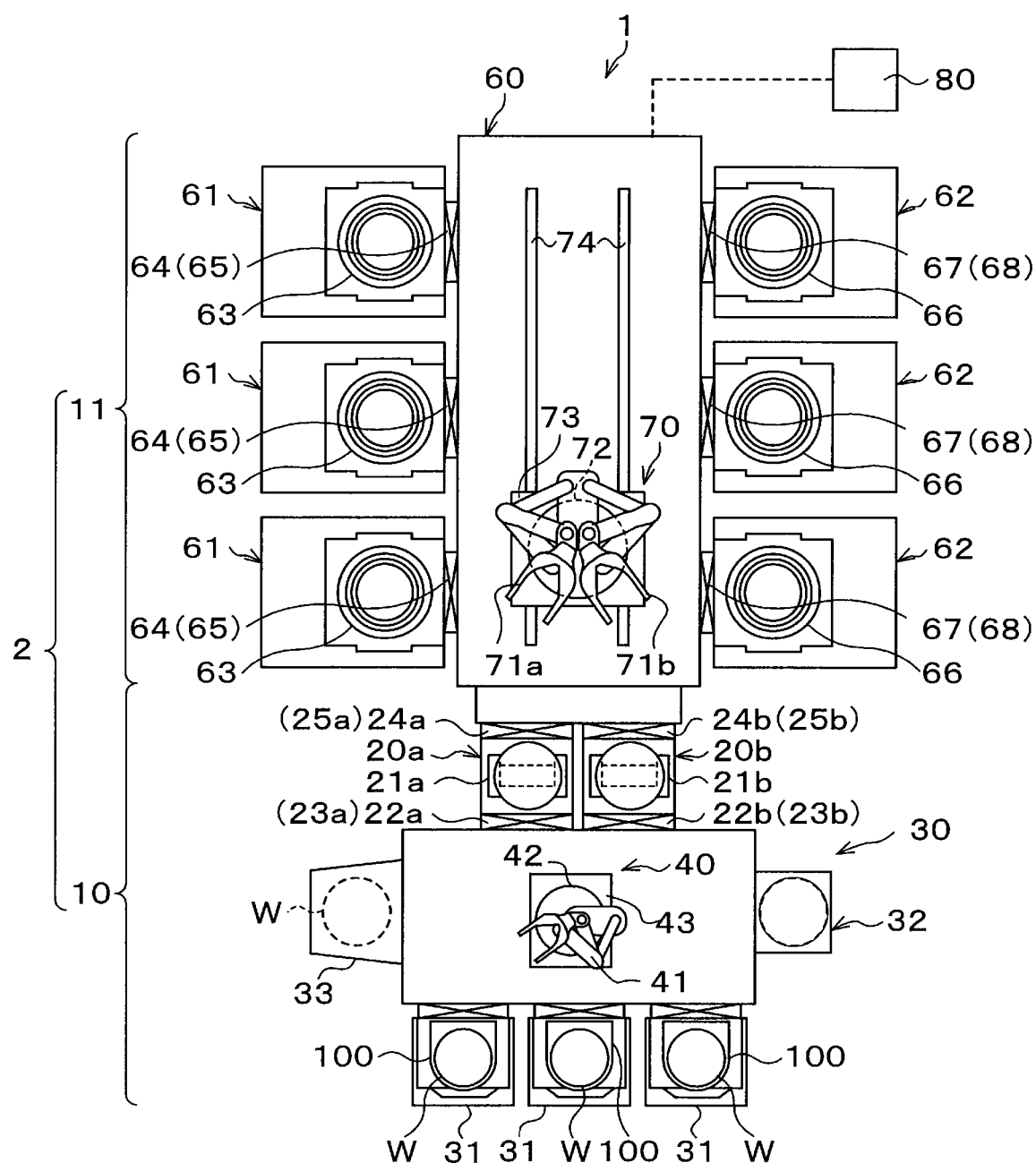
FIG. 1 is a plan view schematically illustrating an exemplary configuration of a wafer processing apparatus according to an embodiment.

A semiconductor device manufacturing process is performed inside, for example, a so-called "clean room" having a high degree of cleanliness. Meanwhile, with an increase in size of the semiconductor wafer (substrate) (hereinafter referred to as a "wafer") and various processing modules for processing the wafer, running costs of the clean room is increasing. Therefore, in recent years, a method has been employed to keep the cleanliness of the interior of the substrate accommodating vessel high. The substrate accommodating vessel is also called a "front-opening unified pod (FOUP)" which is used for transferring the wafer within the interior of the processing module and between the processing modules.

The FOUP is configured to accommodate a plurality of wafers in parallel to each other in multiple stages. In the FOUP, a lid is opened after the FOUP is loaded into a load port of a wafer processing apparatus, and the wafers accommodated in the FOUP are loaded into the wafer processing apparatus. Then, each wafer unloaded from the FOUP is subjected to a certain process in each of the plurality of processing modules included in the wafer processing apparatus, and subsequently, the processed wafer is loaded into (recovered to) the respective FOUP from which the wafer was unloaded, and the lid is closed.

As described above, the lid of the FOUP is opened at the time of unloading the accommodated wafer from the FOUP, and is kept opened until the processing of the wafer is completed and the wafer is loaded into (recovered to) the FOUP again. However, when the lid of the FOUP remains open during the wafer processing, the interior of the FOUP is exposed to an internal atmosphere of the wafer processing apparatus. As a result, the interior of the FOUP may be contaminated, and particles may adhere to the wafers that are located inside the FOUP.

For example, in a case in which an abnormality occurs in the wafer processing apparatus and thus the transfer of the wafer is impossible, when the lid of the FOUP remains open, the interior of the FOUP may be exposed to the internal atmosphere of the wafer processing apparatus for a long period of time. That is, it is highly possible that particles may adhere to the wafers that are located inside the FOUP. In addition, even after all of the wafers accommodated in the FOUP are loaded into the wafer processing apparatus, the internal atmosphere of the FOUP may be contaminated as described above. In this case, particles may adhere to wafers recovered subsequently.

As described above, in the case in which an abnormality occurs in the wafer processing apparatus, in order to suppress the contamination of the interior of the FOUP, it is necessary to reduce a time period during which the interior of the FOUP placed on the load port is exposed to the internal atmosphere of the wafer processing apparatus. That is, it is necessary to suppress the adhesion of particles to the wafers by shortening the time period during which the lid of the FOUP remains opened. However, Patent Document 1 does not teach that when an abnormality occurs in the wafer processing apparatus, for example, the lid of the FOUP is closed to maintain the wafers accommodated in the FOUP in a good state.

Therefore, the technologies according to the present disclosure suppress particles from adhering to wafers on standby inside a FOUP. Specifically, the technology closes a lid of the FOUP placed on a load port in certain conditions where an abnormality occurs in a wafer processing apparatus, for example.

Hereinafter, embodiments will be described with reference to the drawings. In this specification, elements having substantially the same functional configurations will be denoted by the same reference numerals, and redundant descriptions thereof will be omitted.

<Wafer Processing Apparatus>

FIG. 1 is a plan view schematically illustrating a configuration of a wafer processing apparatus 1 as a substrate processing apparatus according to an embodiment. In the present embodiment, a case in which the wafer processing apparatus 1 is provided with various processing modules for performing a COR processing, a PHT processing, and a CST processing on a wafer W will be described as an example. The configuration of the modules of the wafer processing apparatus 1 is not limited thereto, and may be arbitrarily selected.

As illustrated in FIG. 1, the wafer processing apparatus 1 includes a wafer processing part 2 (a substrate processing part) and a controller 80. The wafer processing part 2 is configured to remove the wafer W from a FOUP 100 placed on a load port 31 (to be described later) and to perform a series of processes on the wafer W. The wafer processing part 2 includes an atmospheric-side part 10 kept in an atmospheric pressure atmosphere, a depressurization part 11 kept in a depressurized atmosphere, and load lock modules 20a and 20b. The atmospheric-side part 10 and the depressurization part 11 are connected to each other via the load lock modules 20a and 20b.

The load lock module 20a temporarily holds the wafer W so as to deliver the wafer W transferred from a loader module 30 (to be described later) of the atmospheric-side part 10 to a transfer module 60 (to be described later) of the depressurization part 11. The load lock module 20a includes a stocker 21a configured to hold the wafer W.

The load lock module 20a is connected to the loader module 30 through a gate 23a provided with a gate valve 22a. The load lock module 20a is connected to the transfer module 60 (to be described later) through a gate 25a provided with a gate valve 24a.

The load lock module 20b has the same configuration as that of the load lock module 20a. That is, the load lock module 20b includes a stocker 21b, a gate valve 22b and a gate 23b provided on the side of the loader module 30, and a gate valve 24b and a gate 25b provided on the side of the transfer module 60.

The number and arrangement of load lock modules 20a and 20b are not limited to the above embodiment, and may be arbitrarily designed.

The atmospheric-side part 10 includes the loader module 30 provided with a wafer transfer mechanism 40, load ports 31 on each of which the FOUP 100 as a substrate accommodating vessel capable of accommodating and transferring one or more wafers W is placed, and an atmospheric-side processing module configured to perform processing on the wafer W in an atmospheric pressure atmosphere. The atmospheric-side processing module includes a CST module 32 configured to cool the wafer W and an ORT module 33 configured to adjust a horizontal orientation of the wafer W.

The number and arrangement of load ports 31, CST module 32, and ORT module 33 are not limited to the above embodiment, and may be arbitrarily designed.

The loader module 30 includes the wafer transfer mechanism 40. The wafer transfer mechanism 40 includes a wafer transfer arm 41 configured to hold and move the wafer W, a rotary table 42 configured to rotatably support the wafer transfer arm 41, and a rotatable stage 43 on which the rotary table 42 is placed.

The wafer transfer mechanism 40 is capable of transferring the wafer W between the FOUP 100 placed on the load port 31, the load lock modules 20a and 20b, the CST module 32, and the ORT module 33 by the expansion/contraction operation of the wafer transfer arm 41 and the rotation of the rotary table 41.

Figure 2:
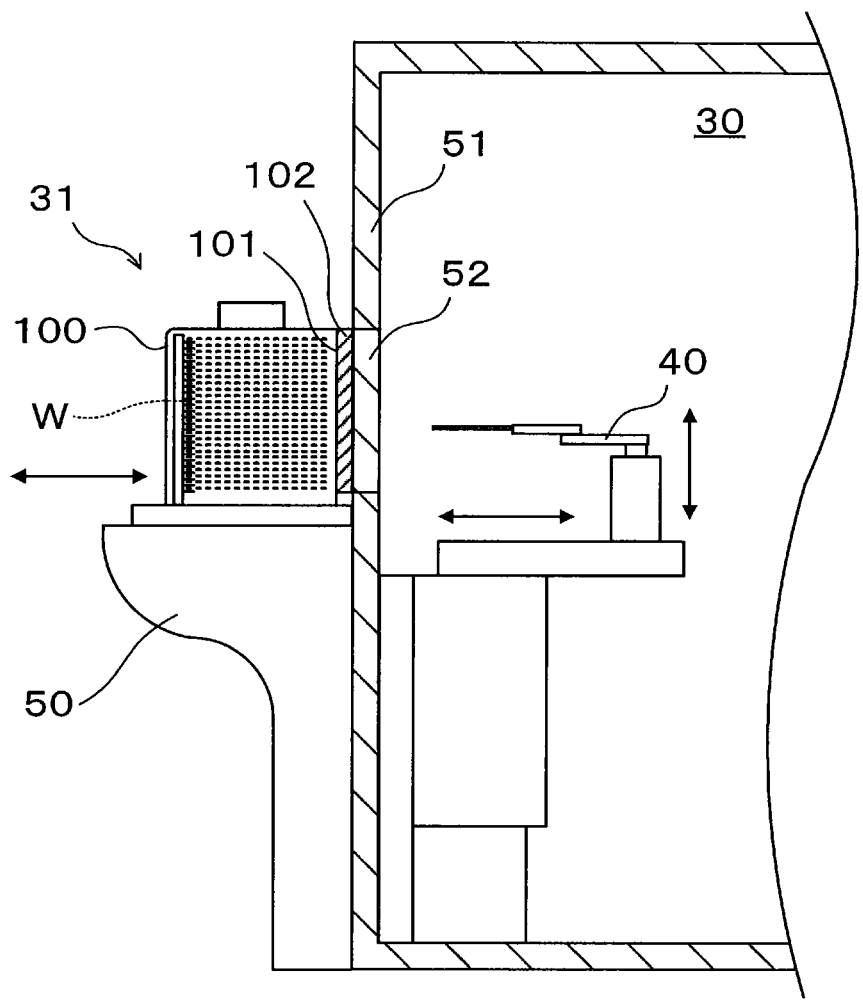
FIG. 2 is a side view illustrating an exemplary configuration of a FOUP according to an embodiment.

As illustrated in FIG. 2, the load port 31 is provided with a stage 50 on which the FOUP 100 is placed. The FOUP 100 accommodates a plurality (e.g., 25 sheets per lot) of wafers which are stacked above one another at equal intervals in multiple stages. The FOUP 100 is formed in a box shape and has an opening 101 formed on a surface facing a partition wall 51 that defines the loader module 30, and a lid 102 fitted into the opening 101 to seal the FOUP 100.

The stage 50 is supported by a support member (not illustrated) provided on an outer surface of the partition wall 51. The stage 50 is configured to be movable in a horizontal direction by a movement mechanism (not illustrated). Thus, the stage 50 can be moved in a front-rear direction with respect to the partition wall 51 together with the FOUP 100.

A port door 52 is provided at a position facing the lid 102 in the partition wall 51. The port door 52 is configured to hold the lid 102 by moving the stage 50 so as to bring the lid 102 into contact with the port door 52.

In addition, the port door 52 is configured to be opened/closed by a drive mechanism (not illustrated). When the drive mechanism is operated in the state in which the port door 52 and the lid 102 are in contact with each other, the lid 102 of the FOUP 100 can be opened and closed. By opening the port door 52 and the lid 102 in this way, the interior of the wafer processing apparatus 1 and the interior of the FOUP 100 become aligned with each other so that the wafer transfer mechanism 40 is accessible to the FOUP 100. That is, it is possible to load the wafer W from the FOUP 100 into the wafer processing apparatus 1.

Descriptions will be made referring back to FIG. 1. The CST module 32 performs a process of cooling the wafer W heated in a PHT module 62 (to be described later).

The ORT module 33 adjusts am horizontal orientation of the wafer W from a reference position (e.g., a notch position).

The depressurization part 11 includes the transfer module 60 configured to transfer the wafer W in a depressurized atmosphere, and a depressurized processing module configured to perform processing on the wafer W transferred from the transfer module 60 under a depressurized atmosphere. The depressurized processing module includes a COR module 61 configured to perform a COR processing, and a PHT module 62 configured to perform a PHT processing. A plurality of (e.g., three) COR modules 61 and a plurality of (e.g., three) PHT modules 62 are provided with respect to the transfer module 60.

As described above, the transfer module 60 is connected to the load lock modules 20a and 20b via the gate valves 24a and 24b. The transfer module 60, which includes a rectangular housing defined therein, transfers the wafer W loaded into the load lock module 20a to one COR module 61 where the wafer W is sequentially subjected to the COR processing and the PHT processing, and unloads the wafer W to the atmospheric-side part 10 via the load lock module 20b.

The COR module 61 places the wafer W on a stage 63 and performs the COR processing on the wafer W. The COR module 61 is connected to the transfer module 60 through a gate 65 provided with a gate valve 64.

The PHT module 62 places the wafer W on a stage 66 and performs the PHT processing on the wafer W. The PHT module 62 is connected to the transfer module 60 through a gate 68 provided with a gate valve 67.

A wafer transfer mechanism 70 configured to transfer the wafer W is provided inside the transfer module 60. The wafer transfer mechanism 70 includes transfer arms 71a and 71b configured to hold and move the wafer W, a rotary table 72 configured to rotatably support the transfer arms 71a and 71b, and a rotatable stage 73 on which the rotary table 72 is placed. In addition, guide rails 74 are provided inside the transfer module 60 to extend in a longitudinal direction of the transfer module 60. The rotatable stage 73 is provided on the guide rails 74, and is configured to move the wafer transfer mechanism 70 along the guide rails 74.

In the transfer module 60, the transfer arm 71a receives the wafer W held in the load lock module 20a and transfers the same to the COR module 61. In addition, the transfer arm 71a holds the wafer W, which has been subjected to the COR processing, and transfers the same to the PHT module 62. In addition, the transfer arm 71b holds the wafer W, which has been subjected to the PHT processing, and transfers the same to the load lock module 20b.

As described above, the wafer processing apparatus 1 is provided with the controller 80. The controller 80 is configured to control the opening/closing of the lid 102 of the FOUP 100 placed on the load port 31. The controller 80 is configured to control each module of the wafer processing part 2 (for example, a module related to target control). The controller 80 performs control to open the lid 102 after the FOUP 100 is placed on the load port 31. When an abnormality occurs in any of the modules of the wafer processing part 2 and none of the wafers removed from the FOUP 100 is to be recovered to the FOUP 100 after a predetermined period of time, the controller 80 performs control to close the lid 102. After the predetermined period of time, the controller 80 performs control to recover the wafer(s) W, which are to be recovered subsequently, to the FOUP 100. After the subsequent wafers W are recovered to the FOUP 100, the controller 80 performs control to close the lid 102. When it is determined that an abnormality occurs in the wafer processing part 2, the controller 80 performs control to stop the series of processes. When it is determined that the abnormality was resolved before the elapse of the predetermined period of time, the controller 80 performs control to resume the series of processes without closing the lid 102. After closing the lid 102, when it is determined that the abnormality was resolved, the controller 80 performs control to open the lid 102 again. The predetermined period of time may be arbitrarily set based on a number of conditions. For example, the predetermined period of time may be set starting from a time point at which the wafer W is removed from the FOUP 100, or may be set starting from a time point at which the abnormality occurs. The controller 80 is, for example, a computer, and has a program storage part (not illustrated). The program storage part stores a program for controlling the processing of the wafer W in the wafer processing apparatus 1. Further, the program storage part stores a control program for controlling various processes by the processor, and a program for causing each component of the wafer processing apparatus 1 to transfer the wafer W according to a processing condition, that is, a processing recipe. The programs may be recorded in a computer-readable storage medium, and may be installed in the controller 80 from the storage medium.

The wafer processing apparatus 1 may be provided with controllers (not illustrated) for individually controlling the modules in addition to the controller 80. For example, the wafer processing apparatus 1 may further include a controller for COR processing configured to control the operation of the COR module 61, a controller for PHT processing configured to control the operation of the PHT module 61, a controller for transfer configured to control the operation of the transfer module, and the like.

In the following description, the ORT module 33, the COR module 61, the PHT module 62, the CST module 32, and the load lock modules 20a and 20b may be collectively referred to as a "processing module". In addition, the wafer transfer mechanism 40 and the wafer transfer mechanism 70 may be collectively referred to as a "transfer module".

<Wafer Processing in Wafer Processing Apparatus 1>

Figure 3:
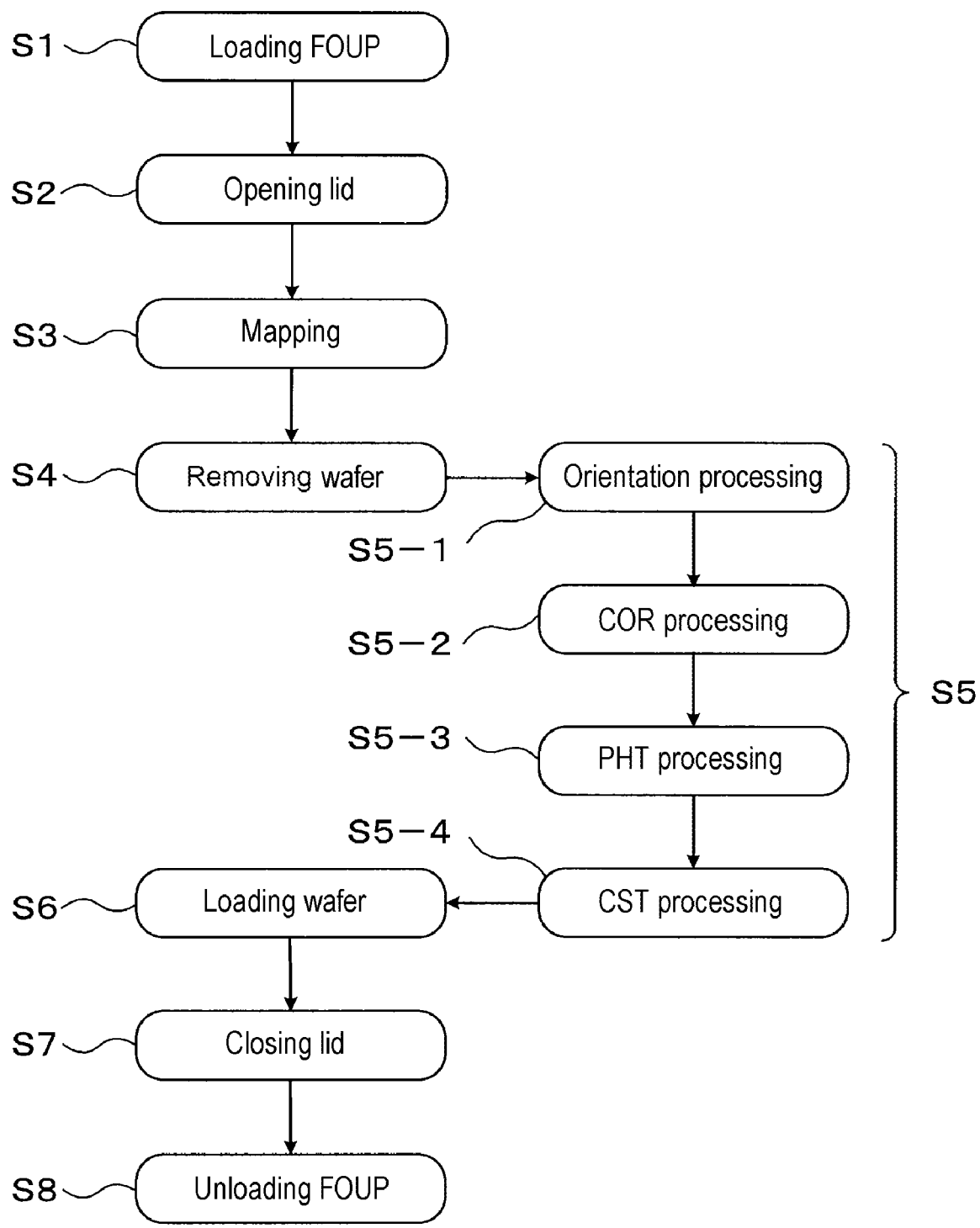
FIG. 3 is a flowchart for explaining an example of a wafer processing according to an embodiment.

Next, a wafer processing in the wafer processing apparatus 1 will be described. FIG. 3 is a flowchart illustrating an exemplary flow of the wafer processing in the wafer processing apparatus 1. In addition, FIG. 4 is an explanatory view illustrating a processing route of the wafer processing illustrated in FIG. 3.

Figure 4:
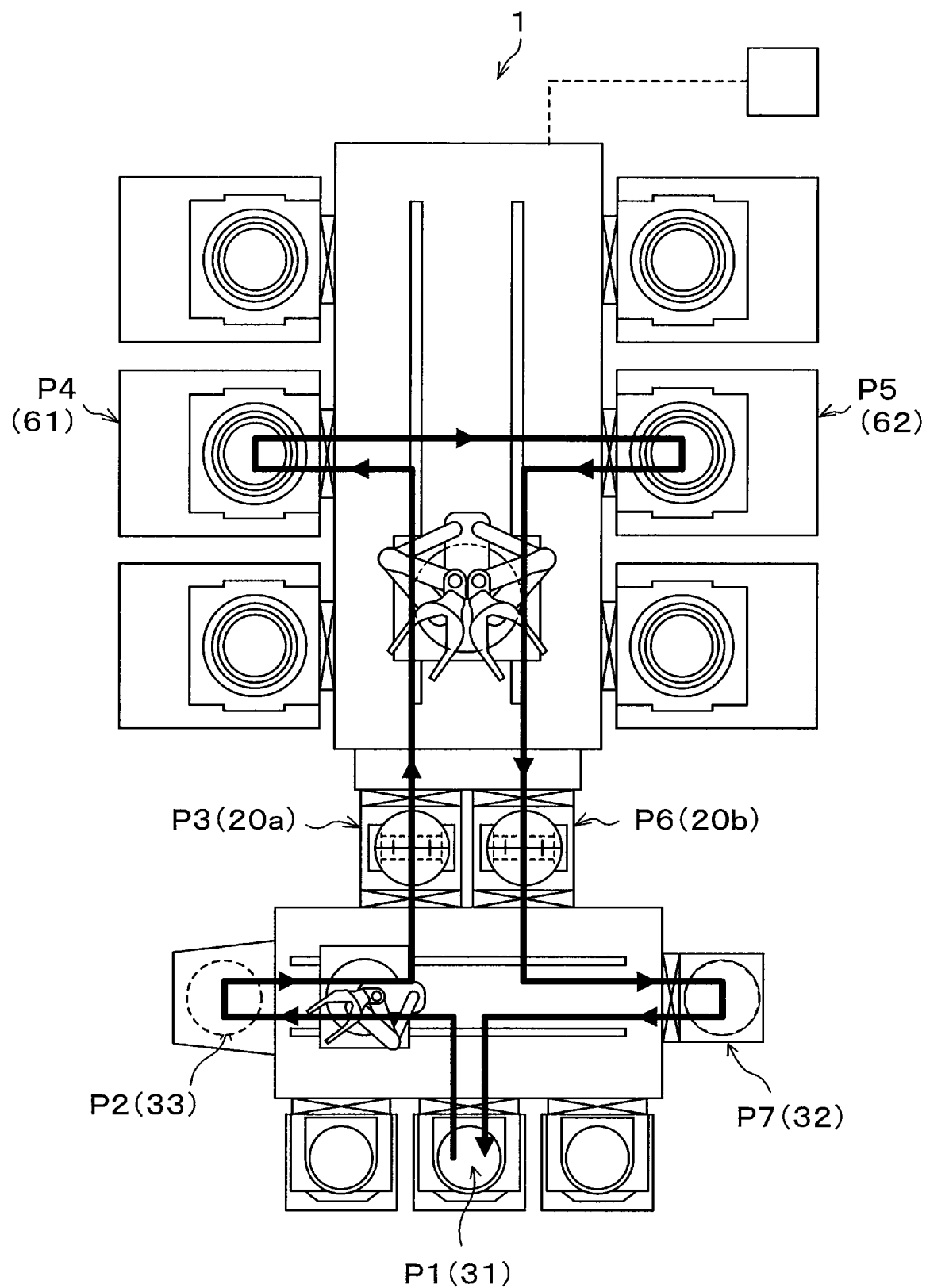
FIG. 4 is an explanatory view schematically illustrating a processing route of the wafer processing according to an embodiment.

First, the FOUP 100 accommodating the plurality of wafers W is loaded into and placed on the load port 31 of the wafer processing apparatus 1 (step S1 in FIG. 3 and position P1 in FIG. 4). Thereafter, the lid 102 of the FOUP 100 and the port door 52 are brought into contact with each other, and the lid 102 is opened as the port door 52 operates (step S2 in FIG. 3).

When the lid 102 of the FOUP 100 is opened, the controller 80 subsequently acquires information on the wafers W accommodated in the FOUP 100 via a mapping mechanism (not illustrated) (step S3 in FIG. 3). Thereafter, the controller 80 determines whether or not to start a series of processes on the wafers W. For example, when it is determined that an abnormality occurs in any module of the wafer processing part 2, the controller 80 determines to not start the series of processes. In this case, the controller 80 performs control to close the lid 102 of the FOUP 100 without starting the series of processes.

Meanwhile, when it is determined to start the series of processes, the controller 80 controls each module of the wafer processing part 2 to take out the wafers W from the FOUP 100. For example, the wafer transfer arm 41 of the wafer transfer mechanism 40 accesses the FOUP 100. Then, one sheet of wafer W, which is to be loaded to the wafer processing part 2 of the wafer processing apparatus 1, is first removed from the FOUP 100 (step S4 in FIG. 3), and the series of processes on the wafer W (step S5 in FIG. 3) is started. The other wafers W accommodated in the FOUP 100 are sequentially unloaded from the FOUP 100 as the processing of the previously-unloaded wafer W progresses. In this case, the wafers W are in a standby state inside the FOUP 100 until the wafers W are unloaded in this way.

In the processing of the wafer W, the wafer W unloaded from the FOUP 100 loaded into the load port 31 is first transferred to the ORT module 33 by the wafer transfer mechanism 40 (steps S5-1 in FIG. 3 and position P2 in FIG. 4). In the ORT module 33, a horizontal orientation of the wafer W at the reference position (e.g., the notch position) is adjusted (in an orientation processing).

The wafer W whose horizontal orientation is adjusted is loaded into the load lock module 20a by the wafer transfer mechanism 40 (position P3 in FIG. 4).

Subsequently, the wafer W is held by the transfer arm 71a of the wafer transfer mechanism 70, and is loaded into the transfer module 60 from the load lock module 20a.

Subsequently, the gate valve 64 is opened, and the transfer arm 71a holding the wafer W enters the COR module 61. Then, the wafer W is placed on the stage 63 from the transfer arm 71a.

Thereafter, the gate valve 64 is closed, and the wafer W is subjected to the COR processing in the COR module 61 (step S5-2 in FIG. 3 and position P4 in FIG. 4).

Subsequently, after the COR processing in the COR module 61 is completed, the wafer W is delivered from the stage 63 to the transfer arm 71a where the wafer W is held.

Subsequently, the gate valve 67 is opened, and the transfer arm 71a holding the wafer W enters the PHT module 62. Then, the wafer W is placed on the stage 66 from the transfer arm 71a. Thereafter, the gate valve 67 is closed, and the wafer W is subjected to the PHT processing (step S5-3 in FIG. 3 and position P5 in FIG. 4).

At this time, the subsequent wafer W waiting in the FOUP 100 is removed, loaded into the load lock module 20a, and transferred to the COR module 61 via the transfer module 60. Then, the COR processing is performed on the subsequent wafer W.

Thereafter, when the PHT processing on the wafer W is completed, the wafer W is delivered from the stage 66 to the transfer arm 71b where the wafer W is held.

Thereafter, the gate valve 24b is opened, and the wafer W is loaded into the load lock module 20b by the wafer transfer mechanism 70 (position P6 in FIG. 4). After the wafer W is loaded into the load lock module 20b, the gate valve 24b is closed, and the interior of the load lock module 20b is sealed and exposed to the atmosphere. Then, the gate valve 22b is opened and the wafer W is accommodated in the CST module 32 by the wafer transfer mechanism 40 where, for example, the wafer W is subjected to the CST processing for one minute (step S5-4 in FIG. 3 and position P7 in FIG. 4).

At this time, the subsequent wafer W, which has been subjected to the COR processing, is transferred to the PHT module 62 by the transfer arm 71a where the PHT processing is performed on the wafer W. In addition, a further subsequent wafer W is removed from the FOUP 100, loaded into the load lock module 20a, and transferred to the COR module 61 via the transfer module 60. Then, the further subsequent wafer W is subjected to the COR processing. In this way, the plurality of wafers W waiting in the FOUP 100 are sequentially transferred to the interior of the wafer processing apparatus 1 where the series of wafer processing described above is performed.

After the CST processing is completed, the wafer W is loaded into the FOUP 100 placed on the load port 31 by the wafer transfer mechanism 40 (step S6 in FIG. 3 and position P1 in FIG. 4). Then, the wafer W loaded into the FOUP 100 is on standby until the processing of the other remaining wafers W accommodated in the FOUP 100 is completed and the processed wafers W are recovered to the FOUP 100.

After all of the wafers W are recovered to the FOUP 100 (step S6 in FIG. 3) and the series of wafer processing performed by the processing module is completed, the lid 102 is closed with the operation of the port door 52 (step S7 in FIG. 3).

Then, after the lid 102 of the FOUP 100 is closed, the FOUP 100 is unloaded from the load port 31 of the wafer processing apparatus 1 (step S8 in FIG. 3), and the series of processes in the wafer processing apparatus 1 is completed.

When the plurality of COR modules 61 and the plurality of PHT modules 62 are provided in the wafer processing apparatus 1 as illustrated in FIG. 1, each of the plurality of COR modules 61 and each of the plurality of PHT modules 62 may be operated in a parallel relationship. That is, the wafer W, the subsequent wafer W, and the further subsequent wafer W may be subjected to the COR processing and the PHT processing at the same time.

In addition, while in the above embodiment, the wafers W has been described to be processed on the basis of one sheet, that is, one by one, inside the wafer processing apparatus 1, the configuration of the wafer processing apparatus 1 is not limited thereto. For example, the wafer processing apparatus 1 may be configured such that two or more wafers W can be simultaneously transferred and processed in the same module.

In the wafer processing described above, the FOUP 100 is on standby with the lid 102 opened between the start and end of the wafer processing in the wafer processing apparatus 1 (steps S2 to S7 in FIG. 3). That is, in the FOUP 100 loaded into the wafer processing apparatus 1, the lid 102 is opened at the start of the wafer processing and is kept in the opened state during the wafer processing. After the wafer processing is completed and all of the wafers W are recovered to the FOUP 100, the lid 102 is closed.

However, in the case in which the opening/closing operation of the lid 102 is controlled in this way, for example, when an abnormality occurs during the wafer processing and the wafers W is not capable of being loaded into (recovered to) the FOUP 100, the FOUP remains placed with the lid 102 opened. That is, it is not possible to confirm the loading (recovery) of the wafers W, which cannot be recovered due to the abnormality. For this reason, it is determined that wafer processing is underway, and the FOUP continues to wait for the loading of the wafers W which cannot be recovered, in the state in which the lid 102 remains open.

In such a case, the interior of the FOUP 100 is aligned with the interior of the wafer processing apparatus 1. Thus, the internal atmosphere of the FOUP 100 may be contaminated as described above, and particles may adhere to the wafers W waiting inside the FOUP 100. Similarly, particles may also adhere to the wafers W that are recovered subsequently.

<Opening/Closing of Lid of FOUP According to the Embodiment>

An embodiment in which the adhesion of particles to the wafer W is suppressed will be described with reference to the drawings. In the present embodiment, in the case in which the transfer of the wafer W to the FOUP 100 is difficult for some reason during the wafer processing in the wafer processing apparatus 1, the lid 102 of the FOUP 100 is temporarily closed to suppress particles from adhering to the wafer W.

The conditions in which the lid 102 of the FOUP 100 is closed may be broadly classified into, for example, three patterns of abnormal states (A) to (C) as follows. The closing conditions of the lid 102 are not limited thereto, and the lid 102 may be set to be closed at a certain timing.

(A) In a case in which an abnormality occurs in any of the processing modules included in the wafer processing apparatus 1 after the start of the wafer processing (that is, when the controller 80 detects the occurrence of an abnormality in any of the processing modules based on a received signal or the like after the start of the series of wafer processing).

(B) In a case in which a problem occurs in any of the transfer modules included in the wafer processing apparatus 1 after the start of the wafer processing (that is, when the controller 80 detects the occurrence of a problem in any of the transfer modules based on a received signal or the like after the start of the series of wafer processing).

(C) In a case in which there is no wafer W which is being transferred in the wafer processing apparatus 1 after the start of the wafer processing (that is, when the controller 80 detects that there is no water W which is being transferred after the start of the series of processes based on a received signal or the like).

FIGS. 5 to 11 are explanatory views illustrating a sequential flow of the wafer processing in the wafer processing part 2 of the wafer processing apparatus 1 according to a processing recipe. In FIGS. 5 to 11, as an example, a case in which four wafers per lot are processed, and the four wafers W are numbered with W1, W2, W3, and W4 sequentially from the first wafer. The vertical axis of the leftmost column in each figure represents time t in the wafer processing. For example, time "t1" in FIG. 5 represents that all the wafers W1 to W4 are accommodated in the FOUP 100.

In addition, white X marks in FIGS. 5 to 9 and FIG. 11 indicate the module in which an abnormality has occurred and the time at which the abnormality occurred. The wafers W can't be transferred beyond the white X marks. That is, the wafers W cannot pass through the module in which an abnormality has occurred in a processing route. In addition, black X marks in FIG. 10 indicate a lost wafer W and the time at which the wafer was lost. In addition, a portion hatched in the row of FOUP 100 in each of FIGS. 5 to 11 indicates the time at which the lid 102 is closed.

(A) In the case in which an abnormality occurs in any of the processing modules provided in the wafer processing part 2 of the wafer processing apparatus 1 after the start of the wafer processing First, a case in which a processing module located on the processing route of the wafer W unloaded from the FOUP 100 becomes unusable will be described. The expression "the processing module becomes unusable" represents, for example, the following cases.

(a) In a case in which an error (problem) occurs in the processing module and recovery from the occurrence of the error is pending.

(b) In a case in which the processing module requires maintenance.

(c) In a case in which the processing of another wafer W transferred from another FOUP 100 loaded into the wafer processing apparatus 1 is performed in advance in the processing module.

(A-I) in a Case in which a Processing Module Located at a Downstream Route of the Module which is Processing the Wafer W1 Becomes Unusable FIG. 5 illustrates an exemplary case in which the PHT module 62 located in the downstream route of the COR module 61 which is processing the first wafer W1 at time t4, becomes unusable. In this case, the wafer transfer mechanism 70 is not able to load the first wafer W1 into the PHT module 62. Therefore, it is impossible to complete the series of wafer processing for the first wafer W1 which is being currently performed. Thus, it is impossible to recover the first wafer W1 to the FOUP 100. Accordingly, when the occurrence of an abnormality in the PHT module 62 is detected, the controller 80 controls each module of the wafer processing part 2 to stop the series of processes. In this case, the controller 80 performs control to immediately stop the processing of the PHT module 62. In addition, when the wafer W is being processed in the COR module 61 located at the upstream side of the PHT module 62 at the time of detecting the occurrence of an abnormality in the PHT module 62, the controller 80 performs control to stop the operation of the COR module 61 after the COR processing of the COR module 61 is completed. In some embodiments, in a case in which another PHT module is operable normally, the controller 80 may continuously perform the series of processes using the another PHT module without stopping the operation of the COR module 61. Then, when it is determined that the abnormality is not resolved after a predetermined period of time, that is, at time t5, the controller 80 performs control to close the lid 102 of the FOUP 100. As a result, even in the case of the occurrence of the abnormality, the time period during which the interior of the FOUP 100 is exposed to the atmosphere of the wafer processing apparatus 1 is reduced. That is, it is possible to suppress particles from adhering to, particularly the wafer W4 which in on standby in the FOUP 100.

As illustrated in FIG. 5, since the COR processing has not started for the wafers W2 and W3, these wafers W2 and W3 can be recovered to the FOUP 100 by the wafer transfer mechanism 40. Accordingly, after the detection of the occurrence of the abnormality and the predetermined period of time, the controller 80 controls each module of the wafer processing part 2 to recover the wafers W2 and W3 to the FOUP 100 and then close the lid 102 of the FOUP 100. As a result, it is possible to suppress particles from adhering not only to the wafer W4 on standby in the FOUP 100, but also to the wafers W2 and W3, which were unloaded from the FOUP 100. Accordingly, it is preferable that the lid 102 of the FOUP 100 is closed after the predetermined period of time since the controller 80 detects the occurrence of the abnormality and at the timing at which there are no wafers W to be recovered to the FOUP 100.

Meanwhile, when the controller 80 detects that the abnormality is resolved before the elapse of the predetermined period of time before time t5 in FIG. 5, the controller 80 may control the wafer processing apparatus 1 to resume the series of wafer processing without closing the lid 102 of the FOUP 100. At this time, the controller 80 may control each module of the wafer processing part 2 such that, the wafer W4, which has not unloaded from the FOUP 100 at the time of occurrence of the abnormality, is unloaded from the FOUP 100. In some embodiments, the controller 80 may control each module of the wafer processing part 2 such that the wafers W1 to W3, which have already been unloaded from the FOUP 100, are temporally recovered to the FOUP 100 and then the series of wafer processing is resumed. Alternatively, the controller 80 may control each module of the wafer processing part 2 so as to stop the operation of recovering the wafers W1 to W3 and to resume the series of wafer processing at the time of detecting the resolution of the abnormality.

(A-II) in the Case in which the Processing Module which is Processing the First Wafer W1 of the Lot Becomes Unusable FIG. 6 illustrates a case in which the COR module 61 which is processing the first wafer W1 at time t4 becomes unusable. In this case, the wafer transfer mechanism 70 is not able to unload the first wafer W1 from the COR module 61. Therefore, when the controller 80 detects that an abnormality occurs in the COR module 61, the controller 80 controls each module of the wafer processing part 2 to stop the series of processes. In this case, the controller 80 performs control to immediately stop, for example, processing by the COR module 61. Meanwhile, in a case in which the wafer W is being processed in the PHT module 62 located at the downstream side of the COR module 61 at the time of occurrence of the abnormality in the COR module 61, the wafer W can be continuously subjected to the series of processes without being affected by the abnormality of the COR module 61. Therefore, the controller 80 determines the wafer W as being recoverable, and performs control to continue the series of processes for the wafer W. Then, when the controller 80 determines that the abnormality is not resolved after a predetermined period of time, that is, at time t5, the controller 80 performs control to close the lid 102 of the FOUP 100. As a result, even in the case of the occurrence of an abnormality, a time period during which the interior of the FOUP 100 is exposed to the atmosphere of the wafer processing apparatus 1 is reduced. That is, it is possible to suppress particles from adhering to, particularly the wafer W4 which is on standby in the FOUP 100.

As illustrated in FIG. 6, the wafers W2 and W3 can be recovered to the FOUP 100 by the wafer transfer mechanism 40. Accordingly, after the detection of the occurrence of the abnormality and the predetermined period of time, the controller 80 controls each module of the wafer processing part 2 to recover the wafers W2 and W3 to the FOUP 100 and then close the lid 102 of the FOUP 100. As a result, it is possible to suppress particles from adhering not only to the wafer W4 on standby in the FOUP 100, but also to the wafers W2 and W3, which were unloaded from the FOUP 100 but are not being subjected to the series of wafer processing. Accordingly, it is preferable that the lid 102 of the FOUP 100 is closed after the predetermined period of time since the controller 80 detects the occurrence of the abnormality and at the timing at which there are no wafers W to be recovered to the FOUP 100.

Meanwhile, when the controller 80 detects that the abnormality is resolved before the elapse of the predetermined period of time, for example, before time t5 in FIG. 6, the controller 80 may control each module of the wafer processing part 2 to resume the series of wafer processing without closing the lid 102 of the FOUP 100. At this time, the controller 80 may control each module of the wafer processing part 2 such that the wafer W4, which was not unloaded from the FOUP 100 at the time of occurrence of the abnormality, is unloaded from the FOUP 100. In some embodiments, the controller 80 may control each module of the wafer processing part 2 such that the wafers W1 to W3, which have already been unloaded from the FOUP 100, are temporally recovered to the FOUP 100 and then the series of wafer processing is resumed. Alternatively, the controller 80 may control each module of the wafer processing part 2 so as to stop the operation of recovering the wafers W1 to W3 and to resume the series of wafer processing at the time of detecting the resolution of the abnormality.

(A-III) in a Case in which a Processing Module Located in the Upstream Route of the Module which is Processing the Wafer W1 Becomes Unusable FIG. 7 illustrates a case in which a processing module which already processed the first wafer W1 at time t4, for example, the load lock module 20a, becomes unusable. In this case, the wafer transfer mechanism 70 is not able to unload the wafer W2 from the load lock module 20a even if trying to unload the wafer W2. Therefore, when the controller 80 detects that an abnormality occurs in the load lock module 20a, the controller 80 controls each module of the wafer processing part 2 to stop the series of processes. In this case, the controller 80 performs control to immediately stop the processing of the load lock module 20a. Meanwhile, in a case in which the wafer W is being processed in the COR module 61 or the like located at the downstream side of the load lock module 20a at the time of detecting the occurrence of the abnormality in the load lock module 20a, the wafer W can be continuously subjected to the series of processes without being affected by the abnormality of the load lock module 20a. Therefore, the controller 80 determines the wafer W as being recoverable, and performs control to continue the series of processes for the wafer W. Then, when the controller 80 determines that the abnormality is not resolved after a predetermined period of time, that is, at time t5, the controller 80 performs control to close the lid 102 of the FOUP 100. As a result, it is possible to suppress particles from adhering to the wafer W4 which is on standby in the FOUP 100.

At this time, the wafer W 1 in the COR module 61 located at the downstream side of the processing route of the load lock module 20a is capable of being recovered to the FOUP 100 without being affected by the abnormality of the load lock module 20a. In addition, the wafer W3 and the wafer W1 are also capable of being recovered to the FOUP 100 by the wafer transfer mechanism 40 and the wafer transfer mechanism 70. Accordingly, after the predetermined period of time since the controller 80 detects the occurrence of the abnormality, the controller 80 may preferably perform control to close the lid 102 of the FOUP 100 after the wafers W1 and W3 are recovered to the FOUP 100 as illustrated in FIG. 7, for example, at t8. As a result, even in the case of the occurrence of the abnormality, a time period during which the interior of the FOUP 100 is exposed to the atmosphere of the wafer processing apparatus 1 is reduced. Furthermore, since the wafers W1 and W3 are capable of being recovered to the FOUP 100, it is possible to suppress particles from adhering to the wafers W1, W3, and W 4, which are on standby in the FOUP 100.

Meanwhile, when the controller 80 detects that the abnormality is resolved before the elapse of the predetermined period of time, for example, before time t5 to t7 in FIG. 7, the controller 80 may control each module of the wafer processing part 2 to resume the series of wafer processing without closing the lid 102 of the FOUP 100. At this time, the controller 80 may control each module of the wafer processing part 2 such that, for example, the wafer W4, which has not unloaded from the FOUP 100 at the time of occurrence of the abnormality, is unloaded from the FOUP 100. In some embodiments, the controller 80 may control each module of the wafer processing part 2 such that the wafers W1 to W3, which have already been unloaded from the FOUP 100, are temporally recovered to the FOUP 100 and then the series of wafer processing is resumed. Alternatively, the controller 80 may control each module of the wafer processing part 2 so as to stop the operation of recovering the wafers W1 to W3 and to resume the series of wafer processing at the time of detecting the resolution of the abnormality.

(B) In a Case in which a Problem Occurs in any of the Transfer Modules Provided in the Wafer Processing Part 2 of the Wafer Processing Apparatus 1 after the Start of the Wafer Processing FIG. 8 illustrates a case (B-I) in which a problem (abnormality) has occurred in the wafer transfer mechanism 70 at time t4. When a problem occurs in the wafer transfer mechanism 70, it becomes harder to transfer the wafer W1 loaded into the transfer module 60, and thus impossible to recover the wafer W1 to the FOUP 100. Therefore, when the controller 80 detects that a problem occurs in the wafer transfer mechanism 70, the controller 80 controls each module of the wafer processing part 2 to stop the series of processes. Then, when it is determined that the problem has solved after a predetermined period of time, that is, at time t5, the controller 80 performs control to close the lid 102 of the FOUP 100.

As illustrated in FIG. 8, the wafers W2 and W3 can be recovered to the FOUP 100 by the wafer transfer mechanism 40. Accordingly, after the detection of the occurrence of the abnormality and the predetermined period of time, the controller 80 controls each module of the wafer processing part 2 to recover the wafers W2 and W3 to the FOUP 100 and then close the lid 102 of the FOUP 100 at time t6. As a result, it is possible to suppress particles from adhering not only to the wafer W4 on standby in the FOUP 100, but also to the wafers W2 and W3, which were unloaded from the FOUP 100 but are not being subjected to the series of wafer processing. Accordingly, it is preferable that the lid 102 of the FOUP 100 is closed after the predetermined period of time since the controller 80 detects the occurrence of the abnormality and at the timing at which there are no wafers W to be recovered to the FOUP 100.

Meanwhile, when the controller 80 detects that the abnormality is resolved before the elapse of the predetermined period of time, for example, before time t5 in FIG. 8, the controller 80 may control each module of the wafer processing part 2 to resume the series of wafer processing without closing the lid 102 of the FOUP 100. At this time, the controller 80 may control each module of the wafer processing part 2 such that, for example, the wafers W3 and W4, which were not unloaded from the FOUP 100 at the time of occurrence of the abnormality, are unloaded from the FOUP 100. In some embodiments, the controller 80 may control each module of the wafer processing part 2 such that the wafers W1 and W2, which have already been unloaded from the FOUP 100, are temporally recovered to the FOUP 100 and then the series of wafer processing is resumed. Alternatively, the controller 80 may control each module of the wafer processing part 2 so as to stop the operation of recovering the wafers W1 and W2 and to resume the series of wafer processing at the time of detecting the resolution of the abnormality.

The problem in the transfer module refers to, for example, a case in which an error (problem or abnormality) has occurred in the respective transfer module and the recovery is on standby after the occurrence of the error, or a case in which the transfer module requires maintenance.

As described above, even in the case in which the abnormality occurs in the module of the wafer processing part 2 of the wafer processing apparatus 1, when there is a recoverable wafer W, the lid 102 may be closed after the recoverable wafer W is loaded. This makes it possible to appropriately reduce a time period during which the interior of the FOUP 100 is exposed to the atmosphere of the wafer processing apparatus 1, and to suppress the adhesion of particles to the wafer W.

Further, as illustrated in FIG. 9, for example, in the case in which the transfer module in which the problem has occurred at time t4 is the wafer transfer mechanism 40 (B-II), the recovery of all of the wafers W1, W2, and W3 unloaded from the FOUP 100 becomes impossible. Therefore, in such a case, after a predetermined period of time since the problem occurs, namely, at time t5, the lid 102 may be closed without waiting for the recovery of the wafers W1, W2, and W3. This makes it possible to suppress particles from adhering to the wafer W4, which is on standby in the FOUP 100.

(C) In a Case in which there is No Wafer W which is being Transferred in the Wafer Processing Part 2 of the Wafer Processing Apparatus 1.

FIG. 10 illustrates a case in which the controller 80 detects an error (problem or abnormality) based on a received signal or the like at time t4, for example, a case in which the controller 80 detects that the wafer W3 under transfer has been lost due to dropping or the like. In this case, it is impossible to transfer the wafer W3, and thus it becomes impossible to recover the wafer W3 to the FOUP 100. Therefore, when the controller 80 detects the occurrence of the error, the controller 80 controls each module of the wafer processing part 2 to stop the series of processes. Then, when it is determined that the error is not resolved after a predetermined period of time, that is, at time t5, the controller 80 performs control to close the lid 102 of the FOUP 100. This makes it possible to suppress particles from adhering to the wafer W4, which in on standby in the FOUP 100.

In addition, as illustrated in FIG. 10, the wafers W1 and W2 for which the series of wafer processing were started prior to the lost wafer W3 are subjected to the series of processes regardless of the loss of the wafer W3. Thus, the wafers W1 and W2 can be recovered to the FOUP 100. Accordingly, the controller 80 may control each module of the wafer processing part 2 to recover the wafers W1 and W2 to the FOUP 100 and then close the lid 102 of the FOUP 100 at time t9 after a predetermined period of time since the controller 80 detects the occurrence of the error. This makes it possible to suppress particles from adhering to at least the wafers W1 and W2 that are capable of being recovered to the FOUP 100 and the wafer W4 which is on standby in the FOUP 100. In addition, for example, even in a case in which the wafer processing is performed for the wafer W4 to be processed subsequent to the wafer W3 for which the error was detected, it is possible to recover the wafer W4 to the FOUP 100 by tracing back the processing route regardless of the detection of the error related to the wafer W3. Accordingly, it is preferable that the lid 102 of the FOUP 100 is closed after the predetermined period of time since the controller 80 detects the occurrence of the error and at the timing at which there is no wafer W to be recovered to the FOUP 100.

Meanwhile, when the controller 80 detects that the abnormality is resolved before the elapse of the predetermined period of time, for example, at times t5 to t8 in FIG. 8, the controller 80 may control each module of the wafer processing part 2 to resume the series of wafer processing without closing the lid 102 of the FOUP 100. At this time, the controller 80 may control each module of the wafer processing part 2 such that, for example, the wafer W4 which has not unloaded from the FOUP 100 at the time of occurrence of the abnormality, are unloaded from the FOUP 100. In some embodiments, the controller 80 may control each module of the wafer processing part 2 such that the wafers W1 to W3, which have already been unloaded from the FOUP 100, are temporally recovered to the FOUP 100 and then the series of wafer processing is resumed. Alternatively, the controller 80 may control each module of the wafer processing part 2 so as to stop the operation of recovering the wafers W1 to W3 and to resume the series of wafer processing at the time of detecting the resolution of the abnormality.

By the operations in the above cases (A) to (C), for example, the controller 80 may perform control to open the closed lid 102 at an arbitrary timing after detecting the resolution of the abnormality which causes the closing of the lid 102. However, in order to perform control such that the time period during which the lid 102 is opened is as short as possible, it is desirable to open the FOUP in the course of resuming the transfer of wafers W is resumed and unloading or loading any of the wafers W from or into the FOUP 100.

For example, it is assumed that the problem of the PHT module 62 shown in (A-I) in FIG. 5 occurred at time t4, that the lid 102 was closed at time t5, and that the problem was resolved at time t6. In this case, the controller 80 controls each module of the wafer processing part 2 such that the wafers W1, W2, and W3 are respectively transferred to the PHT module 62, the COR module 61, and the load lock module 20a, which are subsequent processing modules, at time t6 at which the problem is resolved. Simultaneously, the controller 80 performs control to open the lid 102 at time t6, since the wafer W4, which in on standby in the FOUP 100, needs to be transferred to the ORT module 33.

Further, for example, FIG. 11 illustrates a case in which a problem occurs in the load lock module 20b at time t5, and the lid 102 was closed at time t6 in the state in which no wafer W was recovered to the FOUP 100. In this case, when it is determined that the problem is resolved at time t7, the controller 80 controls each module of the wafer processing part 2 to resume the processing of the wafers W and performs control to open the lid 102 at time t9 at which the wafer W1, which has been initially subjected to all of the processing, is loaded into the FOUP 100. As described above, it is desirable to open the lid 102 in the course of unloading or loading any of the wafers W from or into the FOUP 100 as described above.

According to the above embodiments, when it is determined that an abnormality occurs in the wafer processing part 2 of the wafer processing apparatus 1 and that the wafer W accommodated in the FOUP 100 can't be transferred through the transfer route of the wafer W after a predetermined period of time from the occurrence of the abnormality, the controller 80 performs control to close the lid 102 of the FOUP 100. That is, even if an abnormality occurs in any module of the wafer processing part 2 of the wafer processing apparatus 1 during the processing of the wafer W, it is possible to shorten a time period during which the interior of the FOUP 100 is exposed to the atmosphere of the wafer processing apparatus 1. Thus, it is possible to appropriately suppress particles from adhering to the wafer W which is on standby inside the FOUP 100. Further, as described above, "the predetermined period of time" described above may be arbitrarily set from various viewpoints. For example, "the predetermined period of time" described above may be any time sufficient to determine whether or not a wafer W which is capable of being transferred through the transfer path presents and to secure a time required to recover the transferable wafer W to the FOUP 100. For example, a time required for an operator to confirm the occurrence of an abnormality and to determine whether or not early resolution of the abnormality is possible may be set as "the predetermined period of time".

At this time, as described above, even when an abnormality has occurred, if the wafer W that is capable of being recovered to the FOUP 100 remains inside the wafer processing apparatus 1, the controller 80 performs control to close the lid 102 after waiting for carry-in of the recoverable wafer W into the FOUP 100. This makes it possible to optimize the number of wafers W for which particle adhesion can be suppressed.

Further, as described above, the controller 80 performs control to close the lid 102 when an abnormality occurs and a predetermined period of time then elapses. Therefore, the controller 80 may perform control such that the lid 102 is not closed when the abnormality is resolved before the predetermined period of time then elapses. This makes it possible to perform an operation in the same wafer processing as that in the conventional case, and to suppress the generation of particles due to the opening/closing operation of the lid 102.

When plurality of processing modules for processing the wafer W (e.g., depressurized processing modules such as the COR module 61 and the PHT module 62) are provided as in the wafer processing apparatus 1 according to the present embodiment, a series of wafer processing may continue even when an abnormality occurs in one processing module. For example, even when the occurrence of an abnormality in one processing module is detected, the controller 80 may control each module of the wafer processing part 2 to continue processing of a wafer to be processed using another processing module without closing the lid 102.

When plurality of FOUPs 100 are loaded into the wafer processing apparatus 1, it is desirable to close only the lid 102 of a FOUP 100, which accommodate recoverable wafers W, which are not capable of being recovered due to the abnormality of a module. That is, it is preferable not to close the lid 102 of a FOUP 100 in which wafers W capable of being recovered to the FOUP 100 are present, but to close only the lid 102 of a FOUP 100 in which recoverable wafers W are not present. This determination is made based on, for example, a transfer recipe for the wafers W accommodated in each FOUP 100.

The embodiments described above have been described with reference to four wafers W per lot for the sake of simplification of the description. Of course, however, the technique of the present disclosure is applicable to a lot including a larger number of wafers W. Even in such a case, it suffices if control is performed to close the lid 102 of the FOUP 100 when an abnormality occurs in a processing module, a predetermined period of time then elapses, and there is no wafer W capable of being recovered to the FOUP 100.

In the embodiments described above, a predetermined period of time for determining the closing of the lid 102 is calculated with reference to the time at which the abnormality occurred in the wafer processing apparatus 1. However, the reference time may be arbitrarily set, and for example, the time at which the wafer transfer mechanism 40 last accessed the FOUP 100 may be used as the reference. In this case, when it is possible to perform control to close the lid 102 at least when a predetermined period of time required for wafer processing in the wafer processing apparatus 1 elapses, a time period during which the lid 102 is open does not become longer than that in the conventional case. That is, it is possible to enjoy the effect of suppressing the adhesion of particles due to the occurrence of an abnormality.

It should be understood that the embodiments disclosed herein are illustrative and are not limiting in all aspects. The above embodiments may be omitted, replaced, or modified in various forms without departing from the scope and spirit of the appended claims.

For example, in the examples described above, a case in which, for example, COR processing or PHT processing is performed in the wafer processing apparatus 1 has been described, but the module configuration is not limited thereto, and any configuration may be adopted. That is, for example, the technique according to the present disclosure is applicable to, for example, a grinding apparatus or a tester. In addition, the technique may be applied to, for example, a coating development apparatus or an etching apparatus.

The following exemplary configuration also falls within the technical scope of the present disclosure.

(1) A substrate processing apparatus including: a substrate processing part including a load port configured to install therein a substrate accommodating vessel in which at least one substrate is accommodated, wherein the substrate processing part is configured to remove the substrate from the substrate accommodating vessel installed on the load port and to perform a series of processes on the substrate; and a controller configured to control an opening and closing of a lid of the substrate accommodating vessel installed on the load port, wherein the controller performs control to open the lid after the substrate accommodating vessel is installed on the load port and performs control to close the lid when an abnormality occurs in the substrate processing part, a predetermined period of time then elapses, and none of substrates removed from the substrate accommodating vessel are capable of being recovered to the substrate accommodating vessel.

According to item (1), even when an abnormality occurs in the substrate processing apparatus, a time period during which the interior of the substrate accommodating vessel is exposed to the atmosphere of the substrate processing apparatus is reduced. As a result, in particular, it is possible to suppress the adhesion of particles to the substrate, which in on standby in the substrate accommodating vessel.

(2) The substrate processing apparatus of item (1), wherein the controller is configured to control the substrate processing part,
the controller performs control such that a recoverable substrate is recovered to the substrate accommodating vessel after the predetermined period of time elapses, and
the controller performs control such that the lid is closed after the recoverable substrate is recovered to the substrate accommodating vessel.

(3) The substrate processing apparatus of item (2), wherein the controller performs control to stop the series of processes when an abnormality occurs in the substrate processing part, and the controller performs control to resume the series of processes without closing the lid when the abnormality is resolved before the predetermined period of time elapses.

(4) The substrate processing apparatus of item (2) or (3), wherein the controller performs control to reopen the lid when the abnormality is resolved after the lid is closed.

(5) The substrate processing apparatus of any one of items (1) to (4), wherein the abnormality is a state in which a module on a substrate processing route in the substrate processing part becomes unusable.

(6) The substrate processing apparatus of item (5), wherein the module becomes unusable when a problem occurs in the module and the module is in a state of waiting for recovery from the problem.

(7) The substrate processing apparatus of item (5), wherein the module becomes unusable when the module requires maintenance.

(8) The substrate processing apparatus of any one of items (5) to (7), wherein the module is a processing module or a transfer module.

(9) The substrate processing apparatus of any one of items (1) to (4), wherein the abnormality is a state in which a substrate disappears from a substrate processing route in the substrate processing part.

(10) A method of opening and closing a lid of a substrate accommodating vessel, the method including:
a step of opening the lid of the substrate accommodating vessel after the substrate accommodating vessel in which at least one substrate is accommodated is placed in a substrate processing apparatus;
a step of removing the substrate from the substrate accommodating vessel; and
a step of closing the lid when an abnormality occurs in the substrate processing apparatus, a predetermined period of time then elapses, and none of substrates removed from the substrate accommodating vessel are capable of being recovered to the substrate accommodating vessel.

EXPLANATION OF REFERENCE NUMERALS

1: wafer processing apparatus, 100: FOUP, 102: lid, W: wafer

What is claimed is:
1. A substrate processing apparatus comprising:
a substrate processing part including a load port configured to place thereon a substrate accommodating vessel in which at least one substrate is accommodated, and configured to remove the at least one substrate from the substrate accommodating vessel placed on the load port and to perform a series of processes on the at least one substrate; and
a controller configured to control an opening and closing of a lid of the substrate accommodating vessel placed on the load port, wherein the controller performs control to open the lid after the substrate accommodating vessel is placed on the load port, and the controller performs control to close the lid when an abnormality occurs in the substrate processing part and when none of the at least one substrate removed from the substrate accommodating vessel are capable of being recovered to the substrate accommodating vessel after a predetermined period of time from the occurrence of the abnormality.

2. The substrate processing apparatus of claim 1, wherein the controller is configured to control the substrate processing part, the controller performs control such that a recoverable substrate is recovered to the substrate accommodating vessel after the predetermined period of time elapses, and the controller performs control such that the lid is closed after the recoverable substrate is recovered to the substrate accommodating vessel.

3. The substrate processing apparatus of claim 2, wherein the controller performs control to stop the series of processes when an abnormality occurs in the substrate processing part, and the controller performs control to resume the series of processes without closing the lid when the abnormality is resolved before the predetermined period of time elapses.

4. The substrate processing apparatus of claim 3, wherein the controller performs control to reopen the lid when the abnormality is resolved after the lid is closed.

5. The substrate processing apparatus of claim 4, wherein the abnormality is a state in which a module on a substrate processing route in the substrate processing part becomes unusable.

6. The substrate processing apparatus of claim 5, wherein the module becomes unusable when a problem occurs in the module and the module is in a state of waiting for recovery from the problem.

7. The substrate processing apparatus of claim 5, wherein the module becomes unusable when the module requires maintenance.

8. The substrate processing apparatus of claim 6, wherein the module is a processing module or a transfer module.

9. The substrate processing apparatus of claim 1, wherein the abnormality is a state in which a substrate disappears from a substrate processing route in the substrate processing part.

10. A method of opening and closing a lid of a substrate accommodating vessel, the method comprising:

opening a lid of the substrate accommodating vessel after the substrate accommodating vessel in which at least one substrate is accommodated is placed in a substrate processing apparatus;

removing the substrate from the substrate accommodating vessel; and closing the lid when an abnormality occurs in the substrate processing apparatus, a predetermined period of time then elapses, and none of the substrates removed from the substrate accommodating vessel are capable of being recovered to the substrate accommodating vessel.

11. The substrate processing apparatus of claim 1, wherein the abnormality is a state in which a module on a substrate processing route in the substrate processing part becomes unusable.

* * * * *